(12) United States Patent
Delpont et al.

(10) Patent No.: US 10,954,407 B2
(45) Date of Patent: Mar. 23, 2021

(54) INK FORMULATIONS BASED ON (SEMI)CONDUCTING NANOPARTICLES

(71) Applicant: GENES'INK SA, Rousset (FR)

(72) Inventors: Nicolas Delpont, Venelles (FR); Virginie El Qacemi, Roquevaire (FR); Emmanuelle Pietri, Peynier (FR); Stephanie Limage, Aix en Provence (FR); Corinne Versini, Aix en Provence (FR); Louis-Dominique Kauffmann, La Crau (FR)

(73) Assignee: GENES'INK SA, Rousset (FR)

( * ) Notice: Subject to any disclaimer, the term of this patent is extended or adjusted under 35 U.S.C. 154(b) by 313 days.

(21) Appl. No.: 15/999,743

(22) PCT Filed: Feb. 15, 2017

(86) PCT No.: PCT/EP2017/053373
§ 371 (c)(1),
(2) Date: Aug. 20, 2018

(87) PCT Pub. No.: WO2017/140712
PCT Pub. Date: Aug. 24, 2017

(65) Prior Publication Data
US 2019/0203062 A1    Jul. 4, 2019

(30) Foreign Application Priority Data

Feb. 18, 2016 (FR) ........................ 1651341

(51) Int. Cl.
| | |
|---|---|
| C09D 11/52 | (2014.01) |
| C09D 11/037 | (2014.01) |
| C09D 11/033 | (2014.01) |
| C09D 11/08 | (2006.01) |
| C09D 11/102 | (2014.01) |
| C09D 11/322 | (2014.01) |
| C09D 11/36 | (2014.01) |
| C09D 11/38 | (2014.01) |
| H05K 1/09 | (2006.01) |

(52) U.S. Cl.
CPC ............ *C09D 11/52* (2013.01); *C09D 11/033* (2013.01); *C09D 11/037* (2013.01); *C09D 11/08* (2013.01); *C09D 11/102* (2013.01); *C09D 11/322* (2013.01); *C09D 11/36* (2013.01); *C09D 11/38* (2013.01); *H05K 1/097* (2013.01)

(58) Field of Classification Search
None
See application file for complete search history.

(56) References Cited

U.S. PATENT DOCUMENTS

| | | | | |
|---|---|---|---|---|
| 9,951,240 | B2 * | 4/2018 | Pietri | C09D 11/322 |
| 2008/0296567 | A1 * | 12/2008 | Irving | H01L 27/1225 |
| | | | | 257/43 |
| 2012/0111409 | A1 * | 5/2012 | Kim | C09D 11/52 |
| | | | | 136/263 |
| 2015/0122334 | A1 * | 5/2015 | Otsubo | H01L 21/02628 |
| | | | | 136/263 |
| 2015/0218190 | A1 * | 8/2015 | Fujdala | C07F 5/00 |
| | | | | 257/43 |
| 2016/0185991 | A1 * | 6/2016 | Pietri | C09D 11/52 |
| | | | | 252/519.3 |
| 2017/0243672 | A1 * | 8/2017 | Cheng | H01B 5/14 |

FOREIGN PATENT DOCUMENTS

| | | |
|---|---|---|
| WO | 2014161100 A1 | 10/2014 |
| WO | 2015000796 A1 | 1/2015 |

OTHER PUBLICATIONS

A. Alkahlout, et al. "Synthesis and Characterization of Aluminum Doped Zinc Oxide Nanostructures via Hydrothermal Route," Hindawi Publishing Corporation Journal of Materials, Mar. 25, 2014, pp. 1-8, vol. 2014.

\* cited by examiner

*Primary Examiner* — Helene Klemanski

(57) ABSTRACT

Ink formulations based on nanoparticles. The present invention relates to ink formulations based on (semi)conducting nanoparticles. In particular, the present invention relates to ink compositions based on zinc oxide and aluminium (semi)conducting nanoparticles suitable for different printing methods.

25 Claims, No Drawings

INK FORMULATIONS BASED ON (SEMI)CONDUCTING NANOPARTICLES

The present invention relates to ink formulations based on (semi)conducting nanoparticles. In particular, the present invention relates to ink compositions based on zinc oxide and aluminium (semi)conducting nanoparticles suitable for different printing methods.

More particularly, the present invention relates to the field of inks based on (semi)conducting nanoparticles suitable for numerous printing methods. As nonlimiting examples, the following printing methods are mentioned: inkjet, spray, screen printing, rotogravure, flexography, doctor blade, spin coating, and slot die coating.

The inks based on (semi)conducting nanoparticles according to the present invention can be printed on all types of supports. The following supports are mentioned as examples: polymers and polymer derivatives, composite materials, organic materials, inorganic materials. In particular, the supports used in the field of printed electronic, for example, PET, PEN, polyimide, glass, PET/ITO, glass/ITO, polycarbonates, PVC as well as all types of active layers used in optoelectronic devices.

The inks based on (semi)conducting nanoparticles according to present invention have numerous advantages among which we mention as nonlimiting examples:
- greater stability over time compared to the current inks; for example, their stability during storage at ambient temperature is much greater than 6 months;
- versatility with regard to their field of application; as preferred examples we mention optoelectronics, photovoltaics and security;
- nontoxicity of the solvents and of the nanoparticles;
- preservation of the intrinsic properties of the nanoparticles;
- preservation of the electronic properties;
- preservation of the fluorescence properties; and, in particular,
- opportunity for producing thick conductive layers with improved properties, for example improved resistance and resilience properties.

The ink according to the present invention, once deposited, is characterized by its work function or WF. The work function is the energy required for an electron to move from the fermi level to the vacuum level.

The work function obtained according to the present invention is stable and constant with temperature and regardless of what support the ink is deposited on. The mean measured value is preferably of the order of 3.6+/±0.5 eV, which is compatible, among other uses, with the electron injection layer use in optoelectronic and photovoltaic devices. Its use as an electron injection layer in an organic photovoltaic cell allows a substantial improvement of the yield in comparison to the use of LiF deposited by CVD.

The present invention also relates to an improved method for preparing said inks; finally, the present invention also relates to the use of said inks in the so-called "security" fields, the fields of photovoltaics, sensors (for example, gas sensors), touch panels, biosensors, and contactless technologies.

In view of the literature of recent years, semiconducting colloidal nanocrystals have received much attention due to their novel optoelectronic, photovoltaic and catalytic properties. This makes them particularly advantageous for future applications in the field of nanoelectronics, solar cells, sensors, and in the biomedical field.

The development of semiconducting nanoparticles makes it possible to use novel implementations and to foresee a multitude of new applications. The nanoparticles have a very high surface/volume ratio and the substitution of their surface with surfactants leads to change in certain properties, in particular optical properties, and the possibility of dispersing them.

Their small dimensions can, in some cases, produce quantum confinement effects. The nanoparticles can be beads (from 1 to 100 nm), small rods (with a length usually lower than 300 nm, for example lower than 200 nm), threads (with a length usually of a few hundred nanometers or a few microns), disks, stars, pyramids, tetrapodes or crystals when they have no predefined form.

Several processes have been developed for the purpose of synthesizing semiconducting nanoparticles. Among them, one can mention in a noncomprehensive list:

physical processes:
- chemical vapor deposition (also known by the name "CVD") when a substrate is exposed to volatilized chemical precursors that react or decompose on its surface. This process generally leads to the formation of nanoparticles whose morphology depends on the conditions used;
- thermal evaporation;
- molecular beam epitaxy, when atoms that will form the nanoparticles are bombarded at high speed onto the substrate (where they become attached) in the form of a gas flow;

chemical or physicochemical processes:
- microemulsion;
- laser pulse in solution, when a solution containing a precursor is irradiated with a laser beam. The nanoparticles are formed in the solution along the light beam;
- Synthesis by irradiation with microwaves;
- Oriented synthesis assisted by surfactants;
- Synthesis under ultrasound;
- Electrochemical synthesis;
- Organometallic synthesis;
- Synthesis in an alcohol medium.

The physical syntheses generally require high temperatures, which makes them poorly suited for switching to production on the industrial scale. In addition, this makes them unsuitable for certain substrates, for example, flexible substrates.

As for chemical syntheses, they have a major advantage for the production of nanoparticles: the semiconducting nanoparticles are dispersed in solvents and, in most cases, not attached to the substrate. Finally, they make it possible to control the shape of the nanoparticles.

The aim of the present invention is to overcome one or more disadvantages of the prior art by providing a stable, versatile and improved ink, which makes it possible to preserve the intrinsic characteristics of the nanoparticles, in particular their electronic properties and, more particularly, the opportunity for producing thick conductive layers with improved properties, for example improved resistance and resilience properties.

According to an embodiment of the present invention, this aim is achieved by means of an ink whose composition includes at least:
a. a compound "a" consisting of aluminium-doped zinc oxide nanoparticles,
b. a compound "b" consisting of an alcohol solvent,
c. an optional compound "c" consisting of an alcohol co-solvent different from compound "b", d. a compound "d" consisting of a dispersant, and
e. an optional compound "e" consisting of a thickener or stabilizer.

The present invention also relates to the use of the claimed ink and/or nanoparticles for producing conductive layer having a thickness superior to 20 nm, preferably superior to 50 nm, for example superior to 80 nm. According to an embodiment of the present invention, there is also provided conductive layer having a thickness superior to 20 nm, preferably superior to 50 nm, for example superior to 80 nm, characterised in that said layers comprise and/or consist in the claimed ink and/or comprise the claimed nanoparticles. Said layers with significant thickness are characterised by an improved conductivity combined with excellent robustness, resistance, resilience and lifetime properties; these advantages allow to broaden the field of use of the nanoparticles and/or the ink according to the present invention; production of photodiodes, in particular on flexible material, is an illustrative example thereof.

The viscosity of the ink according to the present invention is preferably between 1 and 500 mPa·s; the viscosity of the ink according to the present invention is preferably between 1 and 50 mPa·s, for example, between 8 and 40 mPa·s; these two last viscosity ranges are preferred in the absence of compound "e." This viscosity can be advantageously measured using the following method:
Apparatus: Rheometer AR-G2 from TA Instrument
Conditioning time: 1 min
Test type: Continuous ramp
Ramp: Shear rate (1/s)
From: 0.001 to 40 (1/s)
Duration: 10 min
Mode: linear
Measurement: every 10 seconds
Temperature: 20° C.
Curve reprocessing method: Newton's method
Reprocessed area: the entire curve Compound "a" according to the present invention thus consists of aluminium-doped zinc oxide nanoparticles.

According to an embodiment variant of the present invention, the nanoparticles have sizes between 1 and 50 nm, preferably between 2 and 20 nm.

According to an embodiment variant of the present invention, the nanoparticles are of spheroidal and/or spherical shape. For the present invention and the claims that follow, the term "of spheroidal shape" means that the shape resembles that of a sphere but is not perfectly round ("quasi-spherical"), for example, an ellipsoid shape. The shape of the nanoparticles is generally identified by means of photographs taken with a microscope. Thus, according to this embodiment variant of the present invention, the nanoparticles have diameters between 1 and 50 nm, preferably between 2 and 20 nm.

According to a particular embodiment of the present invention, the aluminium-doped zinc oxide nanoparticles have been synthesized beforehand by chemical synthesis. Any chemical synthesis can be used preferably in the context of the present invention. For example, a chemical synthesis is mentioned that uses zinc acetate [$Zn(CH_3COO)_2$] as precursor and an aluminium precursor selected from aluminium nitrate, aluminium chloride, and/or aluminium isopropylate [$Al[OCH(CH_3)_2]_3$]. In general, the precursors are dissolved in a solvent, for example a primary paraffinic aliphatic monohydric alcohol having 1 to 8 carbon atoms or a mixture of two or more of said alcohols; methanol, ethanol, isopropanol, butanol, pentanol, hexanol, heptanol, octanol, and/or a mixture of said alcohols are cited as example; after heating this solution, one adds a solution of potassium hydroxide (KOH) and/or of sodium hydroxide (NaOH) to it, which makes it possible to obtain the desired nanoparticles. In general, the nanoparticles are then subjected to washing which makes it possible to eliminate anything that is not chemically or physically bound to the nanoparticles.

The applicant discovered unexpectedly that the ink compositions including nanoparticles synthesized from the zinc acetate precursor in combination with the aluminium precursor (in particular aluminium isopropylate) have improved properties. The applicant also discovered unexpectedly that the ink compositions including nanoparticles synthesized from the zinc acetate precursor in combination with the aluminium precursor (in particular aluminium isopropylate) in the presence of methanol have even better improved properties. Although the applicant does not wish to be limited to this explanation, the applicant thinks that this improvement could originate from the presence of acetate ligands which originate from the zinc acetate precursor and remain bound to the nanoparticles. Thus, according to a particular embodiment of the present invention, the aluminium-doped zinc oxide nanoparticles have been synthesized beforehand by chemical synthesis by reacting, in methanol, zinc acetate [$Zn(CH_3COO)_2$] and an aluminium precursor.

For showing an example of the effect of methanol as the selected synthesis solvent, a comparison between the use of methanol and ethanol for the nanoparticles synthesis is shown in the following table wherein all other synthesis conditions are identical.

| Reaction solvent | Methanol | Ethanol |
| --- | --- | --- |
| TGA - % acetate ligands on isolated nanoparticules after synthesis | 12.3% | 5.6% |

Although the applicant does not wish to be limited to this explanation, the applicant thinks that this ligand content increase brings not only a better solubilisation of nanomaterials in the solvents of the formulation of the claimed ink but also a better stability of the said ink.

According to a particular embodiment of the invention, the nanoparticles synthesized by chemical synthesis according to the present invention contain 5% to 15% by weight of acetate ligands, for example between 7 and 14%, preferably between 9 and 13%, for example, between 10 and 12% by weight of acetate ligands. This ligand content in the nanoparticle can be measured advantageously according to the following method:
Thermogravimetric analysis
Apparatus: TGA Q50 from TA Instrument
Crucible: Alumina
Method: ramp
Measurement range: from ambient temperature to 600° C.
Temperature rise: 20° C./min According to a particular embodiment of the invention, the nanoparticles synthesized by chemical synthesis according to the present invention are characterised by a molar ratio between aluminium and zinc which is advantageously comprised between 0.1 and 5%, for example between 0.5 and 2.5%. Any appropriate method for the measurement of the concentration in aluminium and in zinc can be used; mass spectrometry measurement methods are preferred (ICP-MS/ICP mass spectrometry).

The crystalline structure of the aluminium-doped zinc oxide nanoparticles was measured by X-ray diffraction (XRD). The results obtained are compared with the crystalline structure of nanoparticles of undoped zinc oxide. No change in the crystalline structure of the wurtzite type is observed between the two materials which confirms a substitution of certain zinc atoms by aluminium atoms.

According to an embodiment of the invention, there is also provided aluminium-doped zinc oxide nanoparticles (which are advantageously used in the claimed inks) which are characterised by a weight content of acetate ligands superior or equal to 5%, preferably superior or equal to 7%, for example superior or equal to 9%.

Thus, according to an embodiment of the invention, the aluminium-doped zinc oxide nanoparticles (which are advantageously used in the claimed inks) are characterised by a weight content of acetate ligands inferior or equal to 15%, preferably inferior or equal to 13%, for example inferior or equal to 12%.

Thus, according to an embodiment of the invention, the aluminium-doped zinc oxide nanoparticles (which are advantageously used in the claimed inks) are characterised by a molar ratio between aluminium and zinc which is superior or equal to 0.1%, for example superior or equal to 0.5%.

Thus, according to an embodiment of the invention, the aluminium-doped zinc oxide nanoparticles (which are advantageously used in the claimed inks) are characterised by a molar ratio between aluminium and zinc which is inferior or equal to 5%, for example inferior or equal to 2.5%.

A particular example of synthesis of nanoparticles according to the present invention is described as an illustration below: in a vessel, a mixture of potassium hydroxide and methanol is prepared under magnetic stirring until a fine dispersion is obtained. In another vessel, under magnetic stirring and at ambient temperature, zinc acetate and aluminium isopropylate are dissolved in a mixture of methanol and water. Then, the potassium hydroxide solution is added dropwise to the zinc acetate and aluminium isopropylate solution in an inert atmosphere and at 60° C. under magnetic stirring, which makes it possible (after decanting and washing) to obtain the aluminium-doped zinc oxide nanoparticles. This synthesis allows the obtention of aluminium-doped zinc oxide nanospheres with a well-controlled particle size distribution; it is thus possible to obtain, depending on the duration of the synthesis steps, spherical nanoparticles having a diameter that can vary from 2 to 10 nm.

In accordance with a preferred embodiment of this invention, the aluminium-doped zinc oxide nanoparticles (which are advantageously used in the claimed inks) are thus synthesized by chemical synthesis, by reducing the zinc acetate and the aluminium precursors by means of a reducing agent in the presence of a synthesis solvent. This synthesis is carried out preferably under non-binding conditions of pressure and temperature such as those defined in this description. Said non-binding conditions of pressure and/or temperature are for example pressure and/or temperature conditions close to normal or ambient conditions. It is preferable to stay within 40% of normal or ambient conditions of pressure and, as regards the temperature, it is generally lower than 80° C., preferably below 70° C. For example, the Applicant found it preferable to maintain the pressure conditions during the preparation of the nanoparticles at values varying at most by 30%, preferably around 15% of normal or ambient pressure conditions, preferably close to atmospheric pressure. A control for these conditions of pressure and/or temperature can be advantageously included in the preparation device for the nanoparticles to fulfill these conditions. In accordance with one particular embodiment of this invention, the duration of the reduction step of the chemical synthesis of the aluminium-doped zinc oxide nanoparticles (which are advantageously used in the claimed inks) must be long enough to allow the appropriate aluminium doping level of the zinc oxide nanoparticles; for example, reduction step durations of at least one hour, preferably at least 2 hours, most preferably at least 3 hours or even at least 5 hours, are preferably used during the synthesis.

In accordance with one particular embodiment of this invention, a liquid phase is always present, both in the reduction step of the precursors as well as in all steps (e.g., the above-mentioned steps of washing and purification) that precede the blending of the nanoparticles with the additional components of the claimed ink. In other terms, one preferred characteristic according to this invention consists in that the nanoparticles are never isolated and dried; it is preferable that they therefore be always in contact with a liquid phase (e.g., a solvent) in which they are dispersed. As shown above in the description, this characteristic makes it possible to considerably improve certain properties (monodispersion, homogeneity, stability and annealing at a very low temperature) of the nanoparticles. This approach eliminates the nanoparticle isolation step and causes a positive impact in terms of production costs, and the health and safety of people.

Compound "a" according to the present invention thus consists of aluminium-doped zinc oxide nanoparticles.

Compound "b" according to the present invention thus consists of an alcohol solvent. The alcohol is preferably selected from the aliphatic monohydric alcohols or their mixtures; preferably from the primary paraffinic aliphatic monohydric alcohols having fewer than 10 carbon atoms. As an example, ethanol, isopropanol and/or butanol, preferably n-butanol are mentioned.

Optional compound "c" according to the present invention thus consists of an alcohol solvent different from compound "b". The alcohol is preferably selected from the unsaturated monohydric alcohols or their mixtures. As an example, the terpenic alcohols, preferably terpineol, preferably alpha-terpineol, are mentioned.

Compound "d" according to the present invention thus consists of a dispersant. Beyond its function as dispersant, which is thus different from the function as solvent of the above-mentioned compounds "b" and "c," compound "d" is different from compounds "b" and "c" used in the composition. This dispersant can be selected advantageously from the family of alcohol amines, polyalcohols, polyalcohols ethers or their mixture. As examples of alcohol amines, dimethanolamine, diethanolamine, and/or ethanolamine and their mixture, and preferably ethanolamine, are mentioned. Also as examples of polyalcohols, ethylene glycol, diethylene glycol, propylene glycol and/or their mixture, and preferably ethylene glycol, are mentioned. Also as examples of polyalcohols ethers, ethylene glycol ether, diethylene glycol ether, propylene glycol ether and/or their mixture, and preferably ethylene glycol ether, are mentioned.

Compound "e" which is optional according to the present invention thus consists of a thickener or stabilizer. Beyond its function as thickener or stabilizer, which is thus different from the dispersant function of compound "d" and the solvent function of the above-mentioned compounds "b" and (optional) "c", compound "e" is different from compounds "b", "c" and "d" used in the composition. As examples, alkyl-cellulose, preferably ethylcellulose, and the modified ureas, preferably polyureas, and/or their mixtures are mentioned. As examples, polyethylenimines, for example polyethylenimine and/or ethoxylated polyethylenimine are also mentioned.

According to an embodiment of the present invention, the ink includes
- a compound "a" in a content of between 0.1 and 15% by weight, preferably less than 15% by weight, preferably between 0.5 and 8% by weight, for example, between 0.5 and 2% by weight,
- a compound "b" in a content of between 9 and 99% by weight, preferably between 9 and 50% by weight,
- an optional compound "c" in a content of between 0.5 and 90% by weight, preferably more than 5% by weight, preferably more than 15% by weight, preferably between 50 and 90% by weight,
- a compound "d" in a content of less than 5% by weight, preferably between 0.05 and 2% by weight, and
- an optional compound "e" in a content of less than 4% by weight, preferably between 0.5 and 2% by weight.

According to an embodiment of the present invention, the ink can also include in its composition other compounds among which we mention as examples solvents (for example, water, alcohols) and/or surfactants, and/or polymers.

However, the compounds "a", "b", "c", "d" and "e" (in the ranges of proportions indicated above) preferably will constitute at least 50% by weight of the final ink, preferably at least 75% by weight, for example, at least 90% by weight, at least 95% by weight, at least 99% by weight, or even 100% by weight of the final ink.

The present invention also relates to a method for preparing an ink formulation according to the present invention, method which includes the following steps:
a) mixing of the nanoparticles (compound "a") with the solvent (compound "b") under stirring,
b) addition to said mixture from the previous step of the dispersant (compound "d") and of (optional) compound "c" and stirring, and,
c) optionally, mixing between the mixture obtained in step b) and compound "e" (this mixing being possibly carried out by adding compound "e" to the mixture obtained in step b), or adding the mixture obtained in step b) to the compound "e"), and stirring, and
d) obtention of an ink.

An alternative to this method for preparing an ink formulation according to the present invention, when the optional compound "e" is present, includes preferably the following steps:
a) mixing of the nanoparticles (compound "a") with a solvent (compound "b") under stirring,
b) addition to said mixture from the previous step of the dispersant (compound "d") and stirring,
c) mixing of the compounds "c" (optional) and "e",
d) mixing between the mixture obtained in step b) and the mixture obtained in step c) (this mixing being possibly carried out by adding the mixture obtained in step c) to the mixture in step b), or adding the mixture obtained in step b) to the mixture obtained in step c)), and stirring, and
e) obtention of an ink.

The ink so obtained can be used directly or it can be diluted to obtain the desired properties.

An additional advantage of the ink according to the present invention lies in the fact that its preparation can be carried out at conditions of pressure and/or temperature that are not restrictive, for example, at pressure and/or temperature conditions close to or identical to the normal or ambient conditions. It is preferable to stick to values that are at least 40% of the values of the normal or ambient pressure and/or temperature conditions (higher or lower). For example, the applicant has observed that it is preferable to maintain the pressure and/or temperature conditions during the preparation of the ink at values varying at most by 30%, preferably by 15% around the values of the normal or ambient conditions. A control of these pressure and/or temperature conditions can thus be included advantageously in the device for preparing the ink so as to satisfy these conditions.

This advantage connected with the preparation of the ink under non-restrictive conditions is quite clearly also reflected in a facilitated use of said inks. According to a preferred embodiment of the invention, the ink can be used advantageously in any printing method, in particular in the following printing methods: inkjet, spray, screen printing, rotogravure, flexography, doctor blade, spin coating, and slot die coating.

The present invention thus also relates to a use of said inks in the so-called "security" fields, the fields of photovoltaics, sensors (for example, gas sensors), touch panels, biosensors, and contactless technologies.

Thus, it is obvious to the person skilled in the art that the present invention allows embodiments in numerous other specific forms without diverging from the field of application of the invention as claimed. Consequently, the present embodiments must be considered illustrative, but they can be modified in the range defined by the scope of the attached claims.

The table below lists three ink compositions according to the present invention. The types of compounds "a," "b", "c" and "d" are indicated in the table as well as their concentration by weight for each one of the compositions. The aluminium-doped zinc oxide nanoparticles used for the three compositions are identical and were obtained using the particular synthesis example described in the text above; said aluminium-doped zinc oxide nanoparticles are characterized by a spherical morphology (as confirmed by scanning electronic microscopy analysis), by an [aluminium:zinc] molar ratio of 1% and by a residual acetate ligand content of 9.5% by weight.

For the present invention and the claims that follow, the percent by weight of compound "a" is calculated on the basis of the weight of the nanoparticles with their ligands.

|  | AZO006 | AZO015 | AZO016 |
|---|---|---|---|
| Compound "a" AZO | 1 | 1 | 1.5 |
| Solvent "b" alcohol 1 IPA isopropanol | 98.8 |  | 98.3 |
| Solvent "b" alcohol 2 BuOH |  | 39.9 |  |
| Solvent "c" alcohol 3 Terpineol |  | 59 |  |
| Dispersant "d" ethanolamine | 0.2 | 0.1 | 0.2 |
| Total % | 100 | 100 | 100 |

The invention claimed is:
1. Ink composition including
   a. a compound "a" consisting of aluminium-doped zinc oxide nanoparticles comprising acetate ligands,
   b. a compound "b" consisting of an alcohol solvent selected from the aliphatic monohydric alcohols or their mixtures, c. an optional compound "c" consisting of an alcohol co-solvent different from compound "b" and selected from the unsaturated monohydric alcohols or their mixtures, d. a compound "d" consisting of a dispersant, and e. an optional compound "e" consisting of a thickener or stabilizer.

2. Ink composition according to claim 1, wherein the compound "a" has a content by weight of acetate ligands which is greater than or equal to 5%.

3. Ink composition according to claim 2, wherein the compound "a" has a content by weight of acetate ligands which is greater than or equal to 7%.

4. Ink composition according to claim 1 wherein the compound "a" has a molar ratio between aluminium and zinc which is comprised between 0.1 and 5%.

5. Ink composition according to claim 1 wherein the ink composition has a viscosity between 1 and 50 mPa·s at a temperature of 20° C.

6. Ink composition according to claim 1, wherein the compound "b" is selected from primary paraffinic aliphatic monohydric alcohols having fewer than 10 carbon atoms.

7. Ink composition according to claim 1, wherein the compound "c" is present and is selected from the unsaturated monohydric alcohols or their mixtures.

8. Ink composition according to claim 1, wherein the compound "d" is selected from the group consisting of alcohol-amines, polyalcohols and polyalcohols ethers.

9. Ink composition according to claim 1, wherein the compound "e" is present and it is selected from alkylcelluloses, polyethylenimines, modified ureas and mixtures thereof.

10. Ink composition according to claim 1 including
a compound "a" in a content of between 0.1 and 15% by weight,
a compound "b" in a content of between 9 and 99% by weight,
an optional compound "c",
a compound "d" in a content of less than 5% by weight, and
an optional compound "e".

11. Ink composition according to claim 1, wherein the compounds "a", "b", "c", "d" and "e" constitute at least 50% by weight of the ink.

12. Ink composition according to claim 4 wherein the compound "a" has a molar ratio between aluminium and zinc which is comprised between 0.5 and 2.5%.

13. Ink composition according to claim 5 wherein the ink composition has a viscosity between 8 and 40 mPa·s at a temperature of 20° C.

14. Ink composition according to claim 6, wherein the compound "b" is selected from ethanol, isopropanol and/or butanol.

15. Ink composition according to claim 14, wherein the compound "b" is n-butanol.

16. Ink composition according to claim 7, wherein the compound "c" is selected terpenic alcohols.

17. Ink composition according to claim 16, wherein the compound "c" is alpha-terpineol.

18. Ink composition according to claim 8, wherein the compound "d" is selected from dimethanolamine, diethanolamine and/or ethanolamine and/or their mixture; ethylene glycol, diethylene glycol, propylene glycol and/or their mixture; ethylene glycol ethers, diethylene glycol ethers, propylene glycol ethers and/or their mixture.

19. Ink composition according to claim 9, wherein the compound "e" is selected from ethylcellulose and/or polyethylenimine and/or ethoxylated polyethylenimine, and/or polyureas, and/or their mixtures.

20. Ink composition according to claim 10 including
a compound "a" in a content of between 0.5 and 8% by weight,
a compound "b" in a content of between 9 and 50% by weight,
a compound "c" in a content of between 0.5 and 90% by weight,
a compound "d" in a content of between 0.05 and 2% by weight, and
a compound "e" in a content of less than 4% by weight.

21. Ink composition according to claim 20 including
a compound "a" in a content of between 0.5 and 2% by weight,
a compound "c" in a content of between 50 and 90% by weight,
a compound "e" in a content between 0.5 and 2% by weight.

22. Ink composition according to claim 1, wherein the compounds "a", "b", "c", "d" and "e" constitute at least 95% by weight of the ink.

23. Conductive layer having a thickness greater than 20 nm, wherein said layer comprises the ink composition according to claim 1.

24. Method for preparing an ink composition according to claim 1 wherein the aluminium-doped zinc oxide nanoparticles (compound "a") are synthesised by chemical synthesis by reacting zinc acetate $[Zn(CH_3COO)_2]$ and an aluminium precursor, the said aluminium precursor being selected from aluminium nitrate, aluminium chloride, and/or aluminium isopropylate $[Al[OCH(CH_3)_2]_3]$, in a solvent selected from a primary paraffinic aliphatic monohydric alcohol having 1 to 8 carbon atoms or a mixture of two or more of said alcohols.

25. Method for preparing an ink composition according to claim 24 wherein the solvent is methanol.

* * * * *